United States Patent
Woo et al.

(10) Patent No.: US 10,962,593 B2
(45) Date of Patent: Mar. 30, 2021

(54) SYSTEM ON CHIP AND OPERATING METHOD THEREOF

(71) Applicant: SAMSUNG ELECTRONICS CO., LTD., Suwon-si (KR)

(72) Inventors: Hyung Il Woo, Uiwang-si (KR); Hyun Chul Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 16/214,978

(22) Filed: Dec. 10, 2018

(65) Prior Publication Data

US 2019/0302180 A1 Oct. 3, 2019

(30) Foreign Application Priority Data

Apr. 3, 2018 (KR) .................. 10-2018-0038758
Jul. 27, 2018 (KR) .................. 10-2018-0087692

(51) Int. Cl.
*G06F 11/30* (2006.01)
*G01R 31/317* (2006.01)
*G06F 11/36* (2006.01)

(52) U.S. Cl.
CPC .... *G01R 31/31705* (2013.01); *G06F 11/3089* (2013.01); *G06F 11/36* (2013.01)

(58) Field of Classification Search
CPC .... G06F 11/36; G06F 11/362; G06F 11/3656; G06F 11/3664; G06F 11/3089; G01R 31/31705
See application file for complete search history.

(56) References Cited

U.S. PATENT DOCUMENTS

| | | | |
|---|---|---|---|
| 7,600,155 B1 | 10/2009 | Nickolls et al. | |
| 8,019,978 B1* | 9/2011 | Shebanow | G06F 11/3024 712/220 |
| 8,239,838 B2 | 8/2012 | Yim et al. | |
| 8,769,495 B1* | 7/2014 | Gupta | G06F 11/3656 714/38.14 |
| 2004/0111707 A1* | 6/2004 | Bliss | G06F 11/362 717/129 |
| 2005/0246688 A1 | 11/2005 | Gupta et al. | |
| 2007/0006154 A1* | 1/2007 | Yang | G06F 11/3636 717/124 |
| 2007/0143759 A1 | 6/2007 | Ozgur et al. | |
| 2010/0332909 A1* | 12/2010 | Larson | G06F 11/3495 714/40 |
| 2016/0062874 A1 | 3/2016 | Brites et al. | |
| 2016/0077905 A1 | 3/2016 | Menon et al. | |
| 2017/0168910 A1* | 6/2017 | Kim | G06F 11/079 |
| 2017/0199835 A1* | 7/2017 | Kim | G06F 13/1605 |
| 2017/0356961 A1* | 12/2017 | Eder | G06F 11/267 |

* cited by examiner

*Primary Examiner* — Yolanda L Wilson
(74) *Attorney, Agent, or Firm* — Sughrue Mion, PLLC

(57) ABSTRACT

A system-on-chip (SoC) includes: a plurality of processors configured to store respective debugging information in response to respective information extraction commands received in a deadlock state, the plurality of processors having different architectures; a system bus connected to the plurality of processors; and an SoC manager configured to generate the respective information extraction commands differently according to an architecture of each of the plurality of processors in response to detecting occurrence of the deadlock state, and transmit the respective information extraction commands to the plurality of processors through a bus separate from the system bus.

19 Claims, 15 Drawing Sheets

SYSTEM ON CHIP AND OPERATING METHOD THEREOF

CROSS-REFERENCE TO THE RELATED APPLICATIONS

This application claims priority from Korean Patent Application No. 10-2018-0038758 filed on Apr. 3, 2018 and Korean Patent Application No. 10-2018-0087692 filed on Jul. 27, 2018 in the Korean Intellectual Property Office, the disclosures of which are incorporated herein by reference in their entirety.

BACKGROUND

1. Field

The present inventive concept relates to a (SoC) and an operating method thereof.

2. Description of the Related Art

In recent years, a (SoC) has been increasingly used. The SoC implements a complex system having various functions in a single chip which includes one or more processors SoC. A plurality of processors included in the SoC may be operated while transmitting and receiving necessary data. During this operation of the SoC, an unintended deadlock state may occur. In order to enable a developer or a user to identify the cause of the deadlock state, a function of obtaining debugging information necessary for debugging from the processors included in the SoC may be implemented in the SoC.

SUMMARY

Example embodiments of the present inventive concept provide a system-on-chip (SoC) and an operating method thereof, the SoC includes a plurality of processors designed according to different architectures and mounted therein, and the SoC is capable of extracting and/or storing debugging information in consideration of an architecture of each of the plurality of processors when a deadlock state occurs.

According to an example embodiment, a SoC includes: a plurality of processors configured to store respective debugging information in response to respective information extraction commands received in a deadlock state, the plurality of processors having different architectures; a system bus connected to the plurality of processors; and an SoC manager configured to generate the respective information extraction commands differently according to an architecture of each of the plurality of processors in response to detecting occurrence of the deadlock state, and transmit the respective information extraction commands to the plurality of processors through a bus separate from the system bus.

According to an example embodiment, an SoC includes: a plurality of processors each of which comprises a first interface, a second interface, and a central processing unit (CPU); a system bus connected to the first interface; at least one debugging master connected to the second interface; and an SoC controller connected to the plurality of processors through the system bus, and configured to detect a deadlock state in the plurality of processors, wherein the debugging master is configured to transmit respective information extraction commands, generated based on an architecture of each of the plurality of processors, to the plurality of processors, in response to an instruction of the SoC controller when the deadlock state occurs, and wherein the plurality of processors are configured to generate respective status information in response to the respective information extraction commands.

According to an example embodiment, a SoC includes: a first processor designed according to a first architecture; a second processor designed according to a second architecture, different from the first architecture; an SoC controller configured to detect a deadlock state in at least one of the first processor and the second processor; and a debugging master connected to a slave interface of each of the first processor and the second processor, and configured to obtain respective debugging information about the first processor and the second processor by transmitting respective information extraction commands to the first processor and the second processor through the slave interface before the first processor and the second processor are reset when the deadlock state occurs, wherein the first processor and the second processor are configured to store the respective debugging information using different methods in response to the information extraction command.

BRIEF DESCRIPTION OF DRAWINGS

The above and other aspects of the inventive concept will be more clearly understood from the following detailed description, taken in conjunction with the accompanying drawings, in which.

DETAILED DESCRIPTION

Hereinafter, the example embodiments of the inventive concept will be described in detail with reference to the attached drawings.

Figure 1:
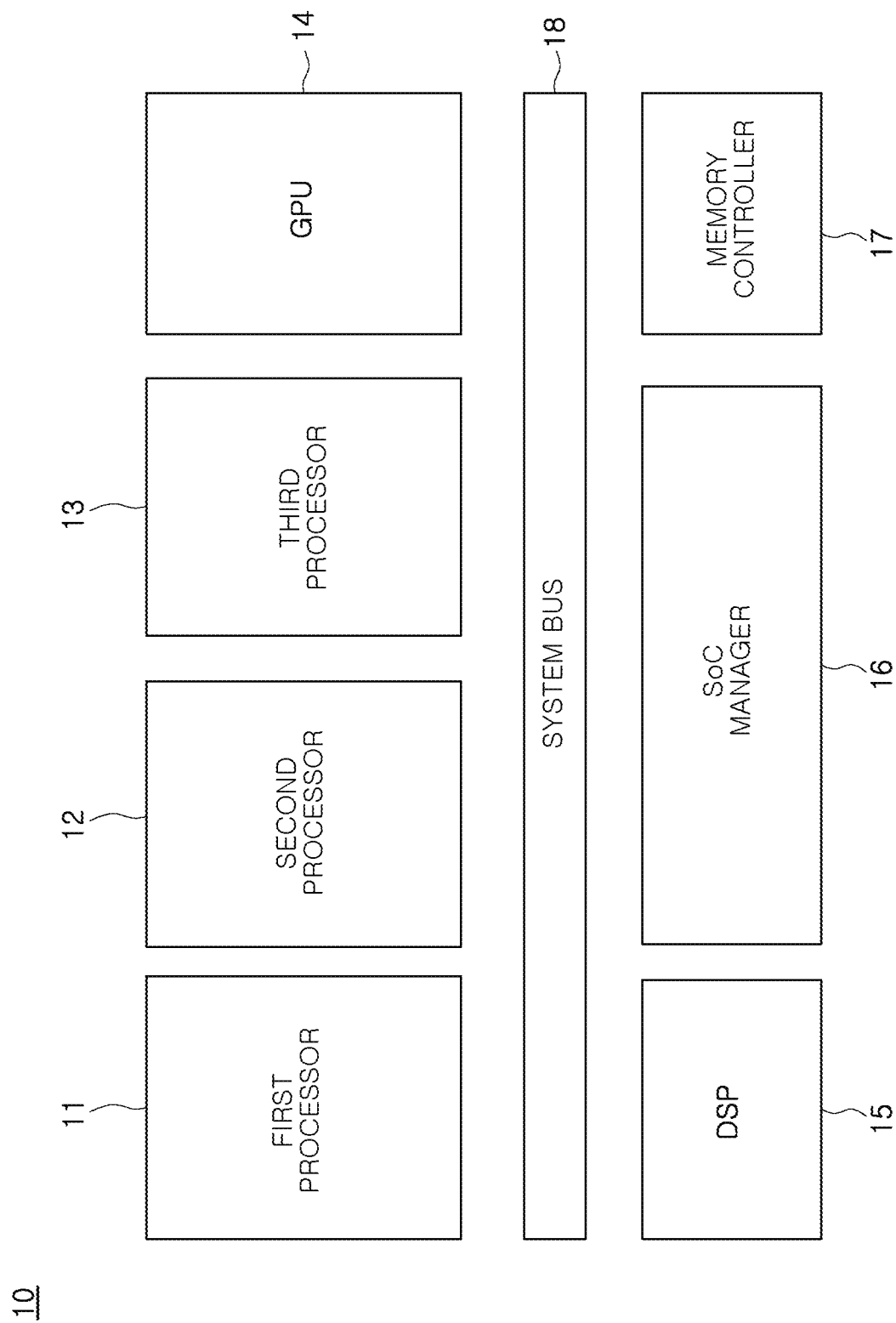
FIG. 1 is a block diagram illustrating a system-on-chip (SoC), according to an example embodiment.

FIG. 1 is a block diagram illustrating a system-on-chip (SoC), according to an example embodiment.

Referring to FIG. 1, an SoC 10 may include components 11 to 17 such as a plurality of processors 11 to 13, a graphics processing unit (GPU) 14, a digital signal processing unit (DSP) 15, an SoC manager 16, a memory controller 17, and the like. The components 11 to 17 may be operated while transmitting and receiving data through a system bus 18. The system bus 18 may include a plurality of interfaces connected to the components 11 to 17, for example, a master interface and a slave interface.

For example, the SoC manager 16 may control an overall operation of the SoC 10, and may include a power management logic, a clock management logic, and the like. The memory controller 18 may include a logic for transmitting and receiving data and a control command to and from a volatile memory or a non-volatile memory provided outside the SoC 10. The GPU 14 may process image data to be displayed on a display device connected to the SoC 10.

The SoC 10 may be mounted in various products such as an electronic device, an autonomous vehicle, and the like, to perform an operation necessary to control these products through the plurality of processors 11 to 13. If necessary, the plurality of processors 11 to 13 may transmit and receive data to and from other components of the SoC 10 through the system bus 19.

When the SoC 10 enters a deadlock state, the SoC 10 may provide information for analyzing a cause of occurrence of a deadlock state, a source code causing the deadlock state, or the like, as debugging information to a developer or a user. The plurality of components 11 to 17 may be designed and implemented according to different architectures, and thus, a process, which must be executed to extract and store debugging information when the deadlock state occurs, may be different for each of the plurality of components 11 to 17.

For example, the first processor 11 may store status information (or state information) in an internal debugging resource for itself by predetermined periods. Thus, when a deadlock state occurs, debugging information about the first processor 11 may be obtained by reading and storing a portion of status information stored in the internal debugging resource of the first processor 11. On the other hand, in the second processor 12 and the third processor 13, a function to store status information in a debugging resource for itself may not be provided. Thus, when the SoC 10 enters a deadlock state, an operation of extracting and storing debugging information from the second processor 12 and the third processor 13 may be executed before the entirety of the SoC 10 or the second processor 12 and the third processor 13 are selectively rebooted. Here, the rebooting may start automatically without a user operation. According to an example embodiment, the status information of each of the first to third processors 11 to 13 may be a bit value stored in a status register included in a corresponding processor.

The SoC manager 16 generates and transmits an information extraction command for storing debugging information to the second processor 12 and the third processor 13. The SoC manager 16 may generate the information extraction command in consideration of the architecture of each of the second processor 12 and the third processor 13. In response to the information extraction command, the second processor 12 and the third processor 13 may output and/or store, as debugging information, respective status information at a point in time at which a deadlock state occurs and before and after, preferably but not necessarily, immediately before and after, the point in time at which a deadlock state occurs. For example, status information within a predetermined time period before and after occurrence of the deadlock state may be output and stored as debugging information.

For example, when a (CPU) responsible for an arithmetic operation, and a subcomponent, capable of obtaining status information from the CPU, are included in the second processor 12, the SoC manager 16 activates the subcomponent to extract and/or store debugging information about the second processor 12. Moreover, for example, the SoC manager 16 may switch the third processor 13 to be in a debugging mode, and may transmit the information extraction command including a predetermined instruction to the third processor 13. In response to the instruction included in the information extraction command, status information about a CPU included in the third processor 13 may be extracted and/or stored as debugging information. For example, the debugging information may be stored in a separate storage space different from the first to third processors 11 to 13. The storage space may be a storage space which is not reset despite selective rebooting of the entirety of the SoC 10 or at least a portion of the first to third processors 11 to 13, and may be provided as a non-volatile memory, or the like.

Meanwhile, a deadlock state occurring in the SoC 10 may be accompanied by an error of the system bus 18. Thus, the SoC manager 16 may transmit an information extraction command for storing debugging information to at least a portion among the components 11 to 17, through a separate path different from the system bus 18. For example, the system bus 18 is logically partitioned to define a first bus and a second bus, and the second bus is inactivated in a normal operation mode and is activated to be used only when a deadlock state occurs. Alternatively, a debugging bus, physically separated from the system bus 18, may be provided to be used in a deadlock state.

Figure 2:
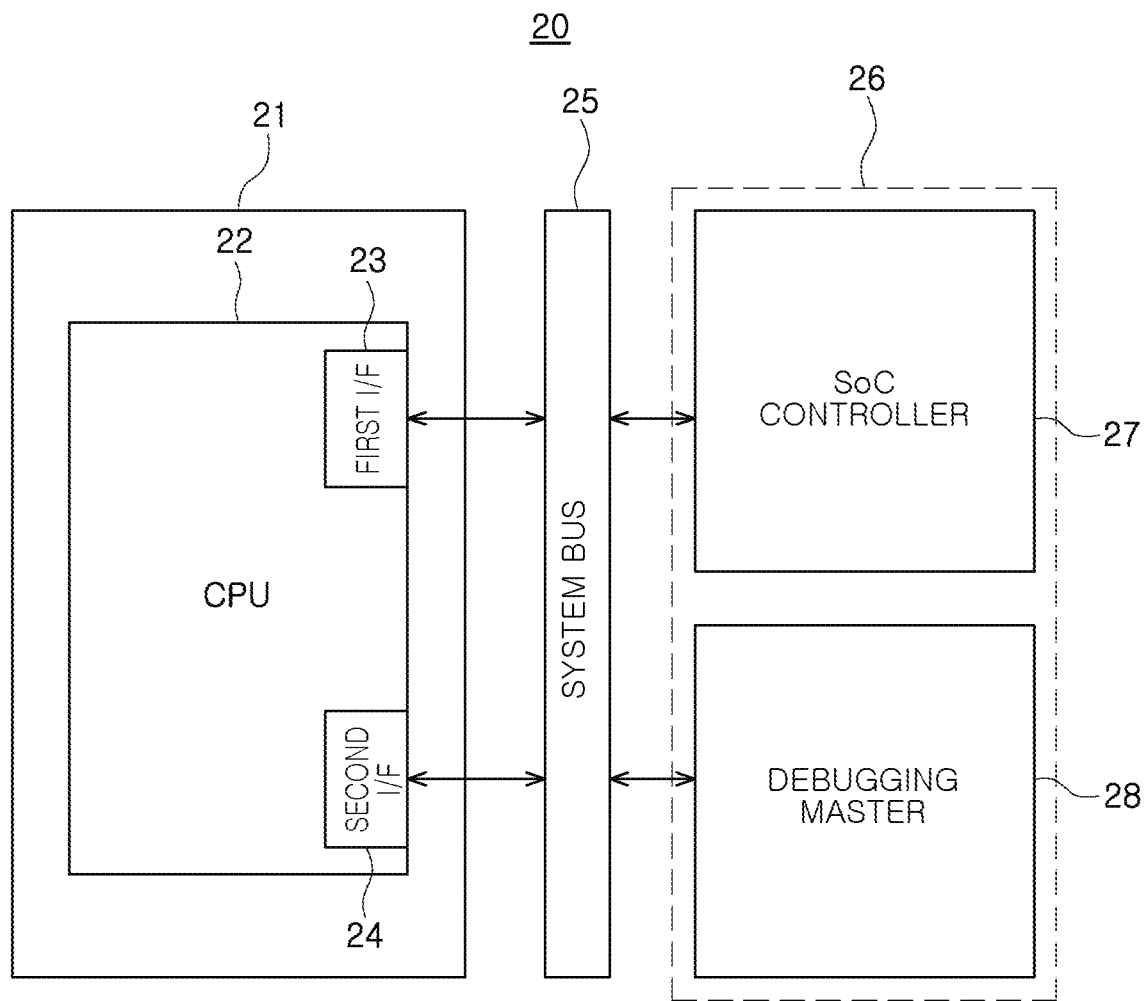
FIGS. 2 and 3 are block diagrams illustrating a processor included in an SoC, according to an example embodiment.
Figure 3:
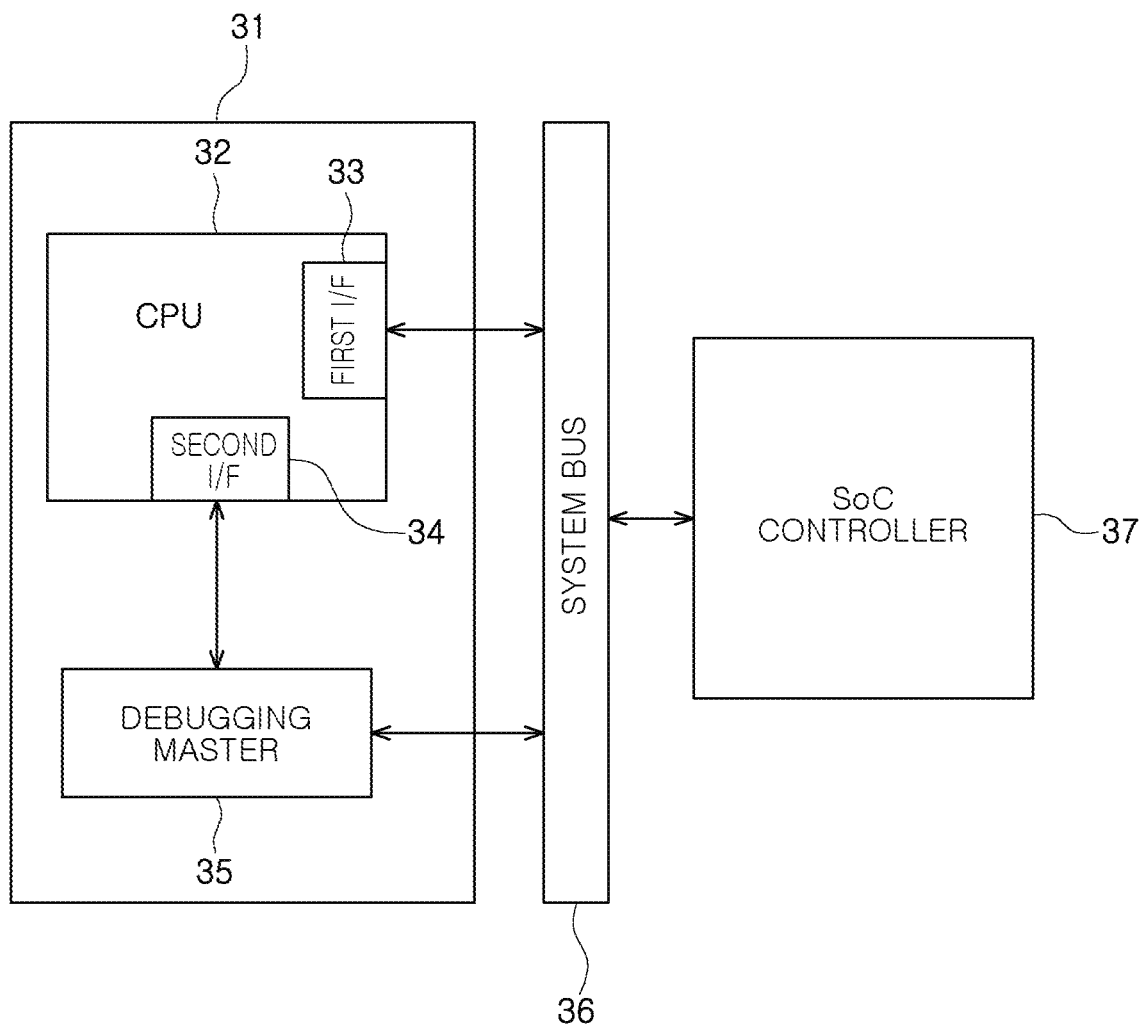

FIGS. 2 and 3 are block diagrams illustrating a processor included in an SoC, according to an example embodiment.

First, referring to FIG. 2, an SoC 20 according to an example embodiment illustrated in FIG. 2 may include a processor 21, a system bus 25, and an SoC manager 26. The SoC manager 26 may include an SoC controller 27 detecting whether a deadlock state occurs, and a debugging master 28 transmitting an information extraction command to the processor 21 to obtain debugging information when a deadlock state occurs.

The processor 21 may have at least one CPU 22 responsible for an arithmetic operation. The CPU 22 may have a first interface 23 and a second interface 24 for transmitting and receiving data to and from other components of the SoC 20. For example, the CPU 22 may transmit and receive data to and from the SoC controller 27 through the first interface 23 and the system bus 25, and may transmit and receive data to and from the debugging master 28 through the second interface 24 and the system bus 25. The first interface 23 may be a master interface, and the second interface 24 may be a slave interface. In other words, when data is transmitted and received between the processor 21 and the debugging master 28 through the second interface 24, the processor 21 may be operated as a slave device for the debugging master 28. The CPU 22 may include two or more cores processing a plurality of instructions and data configuring software.

In a normal operation, the CPU 22 may transmit and receive data to and from the SoC controller 27 and other components of the SoC 20 through the system bus 25. In other words, the CPU 22 may transmit and receive data to and from other components such as a GPU, a digital signal processor (DSP), an internal memory, a memory controller, and the like, in addition to the SoC controller 27 through the first interface 23 and the system bus 25.

When the SoC 20 enters a deadlock state, most of components included in the SoC 20 as well as the processor 21 may stop operating and may not respond. Thus, when the SoC 20 enters a deadlock state, it may difficult to determine which instruction is executed and which data is accessed. Moreover, when the SoC 20 is rebooted to solve a deadlock state, all components are reset. Thus, it may be difficult to identify an instruction, data, and/or a code causing a deadlock state. Due to the situation described above, the efficiency of a debugging operation for eliminating a cause of a deadlock state may be reduced.

According to an example embodiment, the debugging master 28 may extract debugging information about the processor 21 by an instruction of the SoC controller 27 detecting a deadlock state. The debugging master 28 may transmit an information extraction command for obtaining debugging information to the CPU 22 through the second interface 24, not used in a normal operation mode. For example, the debugging master 28 may transmit an appropriate information extraction command suitable for the architecture of the processor 21 to the CPU 22. The system bus 25 may have a first bus and a second bus, logically partitioned, and the information extraction command may be transmitted by the second bus, not used in a normal operation mode.

For example, when a deadlock state occurs, the debugging master 28 may generate and transmit to the processor 21 an information extraction command including instruction to force outputting a status of the processor 21 as debugging information. The debugging information, output by the processor 21 by the instruction, may be stored in a predetermined storage space which is not reset while the SoC 20 is rebooted by the debugging master 28 or the SoC controller 27.

In other example embodiments, by an information extraction command transmitted by the debugging master 28, a subcomponent, included in the processor 21 and different from the CPU 22, may be activated. The subcomponent may extract debugging information from the CPU 22, or may control the CPU 22 to store debugging information in a specific storage space for itself. As can be seen from the example embodiments described above, the debugging master 28 may select an instruction suitable to obtain debugging information in consideration of the architecture of the processor 21, and include the instruction in an information extraction command transmitted to the processor 21. The debugging master 28 may directly generate an information extraction command as above, or may receive the information extraction command from the SoC controller 27 for transmission to the processor 21. Meanwhile, the debugging master 28 may be operated in association with an external debugging tool, for example, a joint test action group (JTAG) debugging tool.

Next, referring to FIG. 3, an SoC 30 according to an example embodiment may include a processor 31, a system bus 36, an SoC controller 37, and the like. According to an example embodiment, a debugging master 35 may be provided between the CPU 32 and the system bus 36. In FIG. 3, the debugging master 35 is included in the processor 31, but the debugging master may be provided as a separate component between the system bus 36 and the processor 31. When the SoC 30 has a separate debugging bus, separated from the system bus 36, the debugging master 35 may be connected between a debugging bus and the processor 31. The debugging master 35 may transmit and receive data to and from the CPU 32 through the second interface 34, a slave interface.

When the SoC 30 enters a deadlock state, the SoC controller 37 may transmit an instruction to the debugging master 35, through the system bus 36, to obtain debugging information. In a deadlock state, an operation of the system bus 36 is also stopped. Thus, the system bus 36 may be partitioned into a first bus and a second bus, the first bus may be only used in a normal operation, and the second bus may be only used when a deadlock state occurs. The SoC controller 37 may transmit an instruction to obtain debugging information to the debugging master 35 through the second bus. Alternatively, as described previously, through a separate debugging bus logically divided from the system bus 36, the SoC controller 37 may transmit an instruction to obtain debugging information to the debugging master 35.

The debugging master 35 may access the CPU 32 through the second interface 34. The debugging master 35 may forcibly extract from the CPU 32 and store the debugging information, or may control the CPU 32 to store debugging information for itself. The debugging information may be stored in a storage space which is not reset while the SoC 30 or the processor 31 is rebooted. For example, the debugging information may be stored in a storage space inside the processor 31, or a storage space of components, other than the processor 31, included in the SoC 30.

Figure 4:
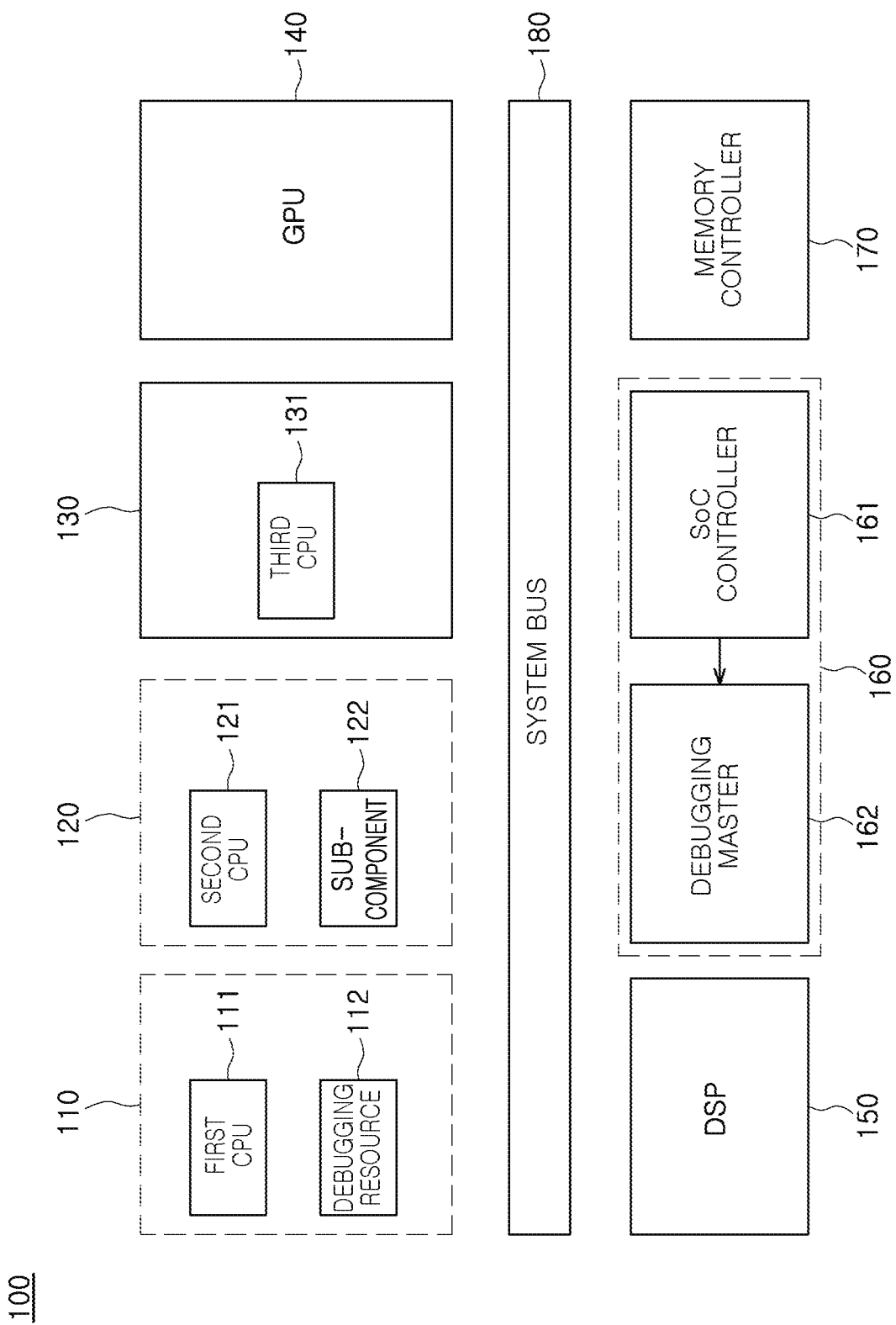
FIGS. 4 and 5 illustrate an operation of an SoC, according to an example embodiment.
Figure 5:
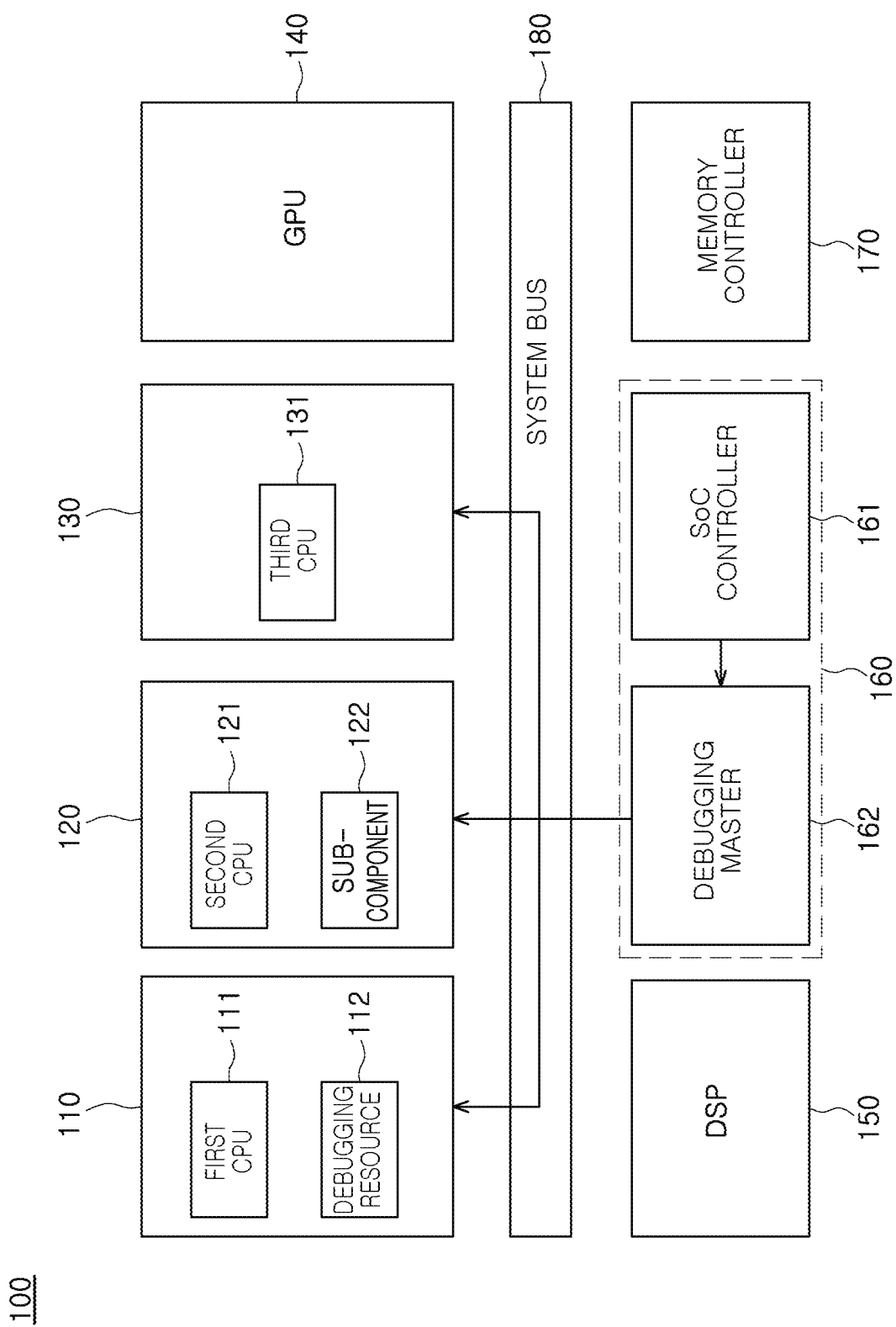

FIGS. 4 and 5 illustrate an operation of an SoC, according to an example embodiment.

Referring to FIGS. 4 and 5, an SoC 100 may include a plurality of processors 110 to 130, a GPU 140, a digital signal processing unit 150, an SoC manager 160, a memory controller 170, and a system bus 180. The SoC manager 160 may include an SoC controller 161 and a debugging master 162.

The components, included in the SoC 100, may be added or changed variously, according to a function to be implemented and provided as the SoC 100. For example, in addition to the components illustrated in FIGS. 4 and 5, a logic responsible for video/audio codec processing, a logic for processing information collected by various sensors connected to the SoC 100, and the like, may be further included.

As illustrated in FIGS. 4 and 5, the plurality of processors 110 to 130 may have different architectures. For example, the first processor 110 may include a first CPU 111 and a debugging resource 112, and status information of the first CPU 111 may be stored in the debugging resource 112 by predetermined periods. When the SoC 100 enters a deadlock state, the debugging master 162 accesses the debugging resource 112 of the first processor 110 to mark or read status information stored at a time point near a time point at which a deadlock state occurs, for example, immediately before and after the occurrence of the deadlock state, among status information stored in the debugging resource 112, as debugging information, thereby obtaining debugging information about the first processor 110.

In a manner different from the first processor 110, the second processor 120 and the third processor 130 may not provide a function to automatically and/or periodically store status information which may be used as debugging information. Thus, when the SoC 100 enters a deadlock state, the debugging master 162 may obtain debugging information from each of the second processor 120 and the third processor 130 in response to an instruction from the SoC controller 161.

First, referring to FIG. 4, as the SoC 100 enters a deadlock state, operations of the plurality of processors 110 to 130, the GPU 140, the digital signal processing unit 150, the memory controller 170, and the like may be stopped. In the deadlock state, the system bus 180 may also not be operated normally.

The deadlock state may be detected by the SoC controller 161. For example, at least one of the plurality of processors 110 to 130, the GPU 140, the digital signal processing unit 150, and the memory controller 170 may include a counter circuit therein, and the SoC controller 161 may receive a signal from the counter circuit by predetermined periods. Thus, if a signal is not received from the counter circuit even though the period has elapsed, the SoC controller 161 may determine that the SoC 100 enters a deadlock state. Alternatively, when a predetermined specific situation occurs regardless of whether or not a signal is received from the counter circuit, or when an interrupt indicating occurrence of a malfunction is detected, the SoC 100 may be determined to have entered a deadlock state.

When the SoC 100 is determined to have entered a deadlock state, in response to an instruction of the SoC controller 161, the debugging master 162 may transmit an information extraction command for obtaining debugging information to at least one of the components of the SoC 100. Referring to FIG. 5, the debugging master 162 transmits an information extraction command to the plurality of processors 110 to 130, but the information extraction command for obtaining debugging information may also be transmitted to the GPU 140, the digital signal processing unit 150, the memory controller 170, and the like.

The information extraction command may include various instructions determined according to the architecture of the plurality of processors 110 to 130. For example, by the information extraction command transmitted to the first processor 110, at least a portion of status information stored in the debugging resource 112 may be selected as debugging information of the first processor 110 to be separately stored. Moreover, by the information extraction command transmitted to the second processor 120, a subcomponent 122 is activated to extract from the second CPU 121 and store the debugging information. In another example embodiment, by the information extraction command from the debugging master 160, the second processor 120 may be controlled to forcibly output debugging information. The debugging information, forcibly output from the second processor 120, may be stored in a predetermined storage space inside the SoC 100 by the debugging master 160. As described previously, the debugging master 160 may store debugging information in a storage space which is not reset by rebooting of the SoC 100.

Meanwhile, a third CPU 131 of the third processor 130 may execute a predetermined instruction included in an information extraction command received from the debugging master 160, thereby extracting and storing debugging information in an internal register. The debugging information may be stored in a storage space which is not reset by a rebooting of the SoC 100. For example, the storage space storing debugging information may be a storage space located outside the third CPU 131.

In summary, the plurality of processors 110 to 130 may have different architectures, and thus, a method for extracting and storing respective debugging information when the SoC 100 enters a deadlock state is also different. In an example embodiment, the SoC controller 161 and/or the debugging master 162 recognizes the architecture of each of the plurality of processors 110 to 130, thereby selecting an appropriate method for extracting and storing debugging information for each of the plurality of processors 110 to 130. The SoC controller 161 and/or the debugging master 162 may transmit an information extraction command, generated with reference to a method for extracting and storing debugging information selected based on the architecture, to the plurality of processors 110 to 130. Thus, debugging information may be stored using an optimal method for each of the plurality of processors 110 to 130. Moreover, after the SoC 100 is rebooted, a developer or a user may efficiently analyze a cause of an occurrence of a deadlock state by using the debugging information.

Figure 6:
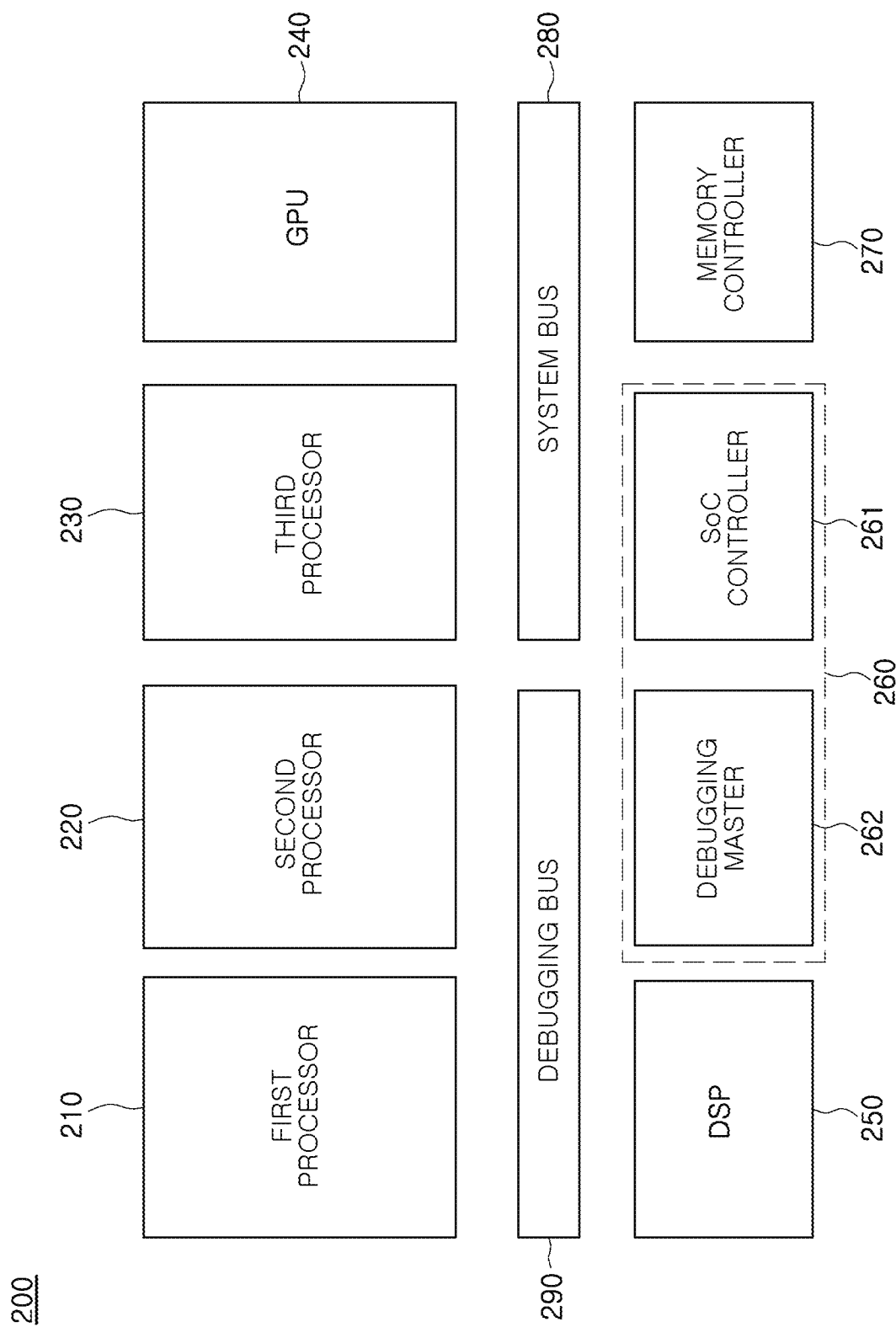
FIG. 6 is a block diagram illustrating an SoC, according to an example embodiment.

FIG. 6 is a block diagram illustrating an SoC, according to an example embodiment.

Referring to FIG. 6, an SoC 200 according to an example embodiment may include a plurality of processors 210 to 230, a GPU 240, a digital signal processing unit 250, an SoC manager 260, a memory controller 270, and the like. The components 210 to 270 may be operated while communicating one another through a system bus 280. The SoC manager 260 may include an SoC controller 261 and a debugging master 262.

In FIG. 6, in addition to the system bus 280, a debugging bus 290 is included in the SoC 200. The debugging bus 290 may be a bus physically separated from the system bus 290, and an inactivated state may be maintained in a normal operation mode. The debugging bus 290 may be activated by the SoC manager 260, when the SoC 200 enters a deadlock state. Hereinafter, with reference to FIGS. 7 and 8, an operation of the SoC 200 will be described in more detail.

Figure 7:
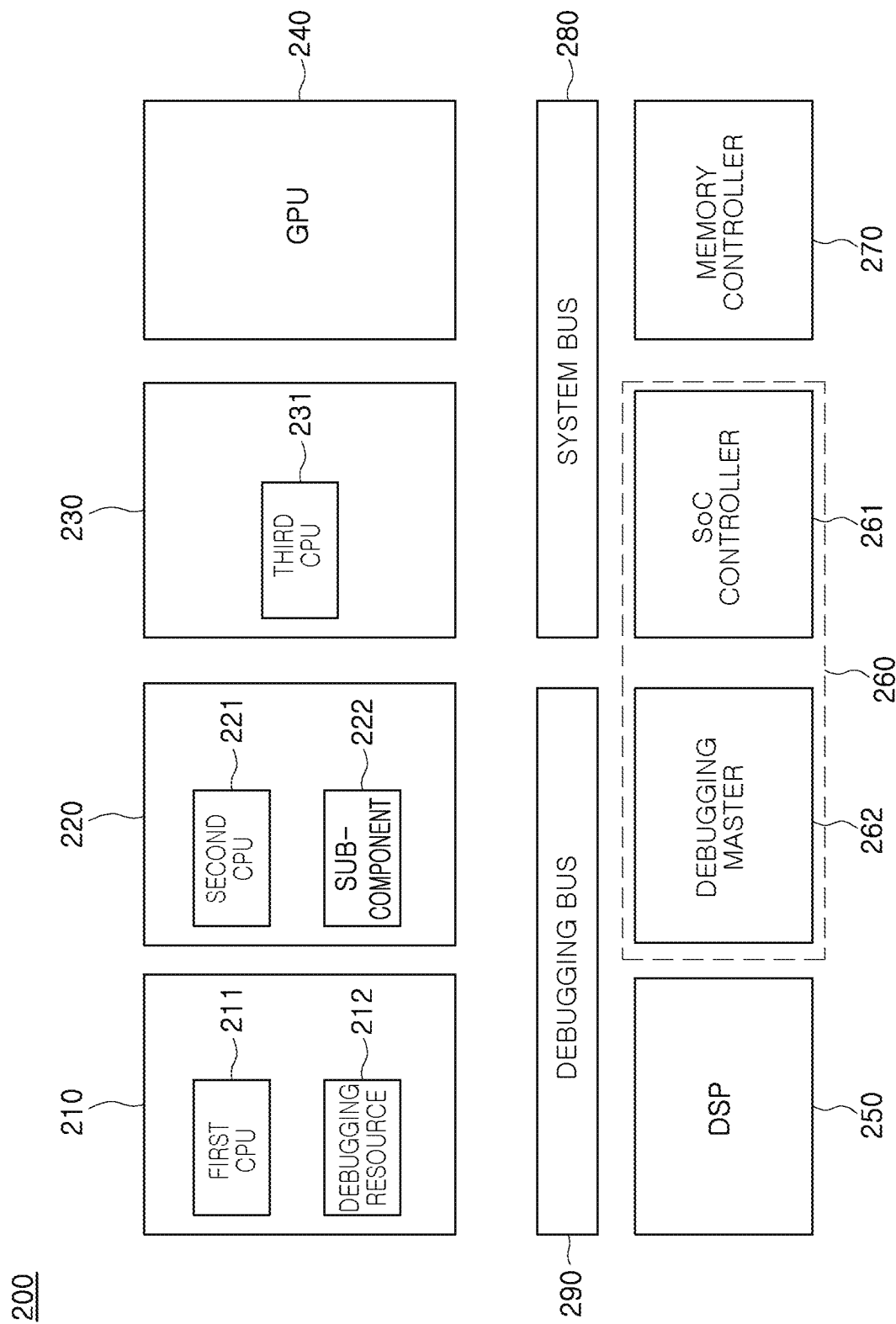
FIGS. 7 and 8 illustrate an operation of an SoC, according to an example embodiment.
Figure 8:
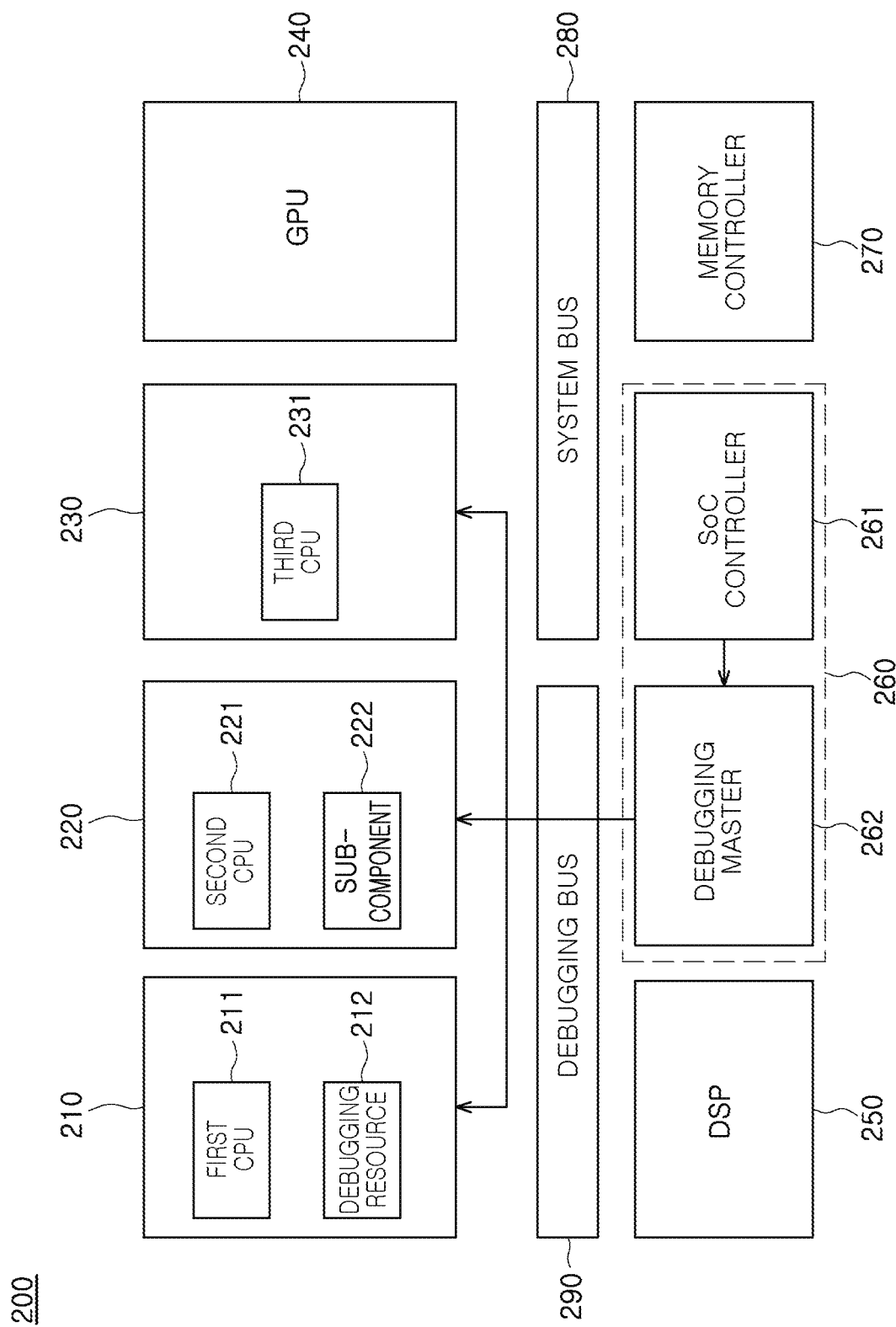

FIGS. 7 and 8 illustrate an operation of an SoC, according to an example embodiment.

Referring to FIGS. 7 and 8, the plurality of processors 210 to 230 may have different architectures. For example, the first processor 210 may include a first CPU 211 and a debugging resource 212, and the first CPU 211 may store status information for each set period and/or when a deadlock state occurs as debugging information in the debugging resource 212. Thus, when the SoC 200 enters a deadlock state, debugging information about the first processor 210 may be extracted from the debugging resource 212 and may be stored in a predetermined storage space before the SoC 200 is rebooted. When a rebooting of the SoC 200 is completed, the debugging information stored in the storage space may be provided to a user or a developer. In other words, in the first processor 210, debugging information may be obtained only by selecting and separately storing a portion of status information stored in the debugging resource 212.

The second processor 220 and the third processor 230 may not provide a function of the first processor 210 which automatically and/or periodically stores debugging information. Thus, when the SoC 200 enters a deadlock state, the debugging master 262 may respond to an instruction from the SoC controller 261 or the debugging master 262 for itself may obtain debugging information from each of the second processor 220 and the third processor 230.

First, referring to FIG. 7, as the SoC 200 enters a deadlock state, operations of the GPU 240, the digital signal processing unit 250, the memory controller 270, and the like, as well as the plurality of processors 210 to 230 may be stopped. In a deadlock state, an operation of the system bus 280 may also be stopped.

The SoC controller 261 may generate and transmit an information extraction command for obtaining debugging information to the debugging master 262. Alternatively, the SoC controller 261 transmits only an instruction for obtaining debugging information to the debugging master 262, and the debugging master 262 may generate an information extraction command including the instruction. In other words, the information extraction command may be generated by at least one of the SoC controller 261 and the debugging master 262.

The debugging master 262 may transmit an information extraction command to the plurality of processors 210 to 230 through the debugging bus 290. The debugging bus 290 may be activated after the SoC 200 enters a deadlock state. Meanwhile, an information extraction command may also be transmitted to other components such as the GPU 240, the digital signal processing unit 250, the memory controller 270, and the like. The type and number of components to received the information extraction command may be determined by the SoC controller 261.

The plurality of processors 210 to 230 have different architectures, so an information extraction command transmitted to each of the plurality of processors 210 to 230 may include different instructions. For example, an information extraction command transmitted to the first processor 210 may include an instruction to select debugging information from status information stored in the debugging resource 212, and record the selected debugging information on a separate storage space.

The second processor 220 may not include a debugging resource 212 unlike the first processor 210. The information extraction command transmitted to the second processor 220 may include an instruction to force the second CPU 221 to output debugging information, or may include an instruction for controlling to activate the subcomponent 222 to extract debugging information from the second CPU 221. The information extraction command transmitted to the third processor 230 may include instructions processed by the third CPU 231 to control the third CPU 231 to record debugging information on a predetermined storage space. In other words, different information extraction commands having instructions determined according to the architecture of each of the plurality of processors 210 to 230 may be transmitted to the plurality of processors 210 to 230.

Figure 9:
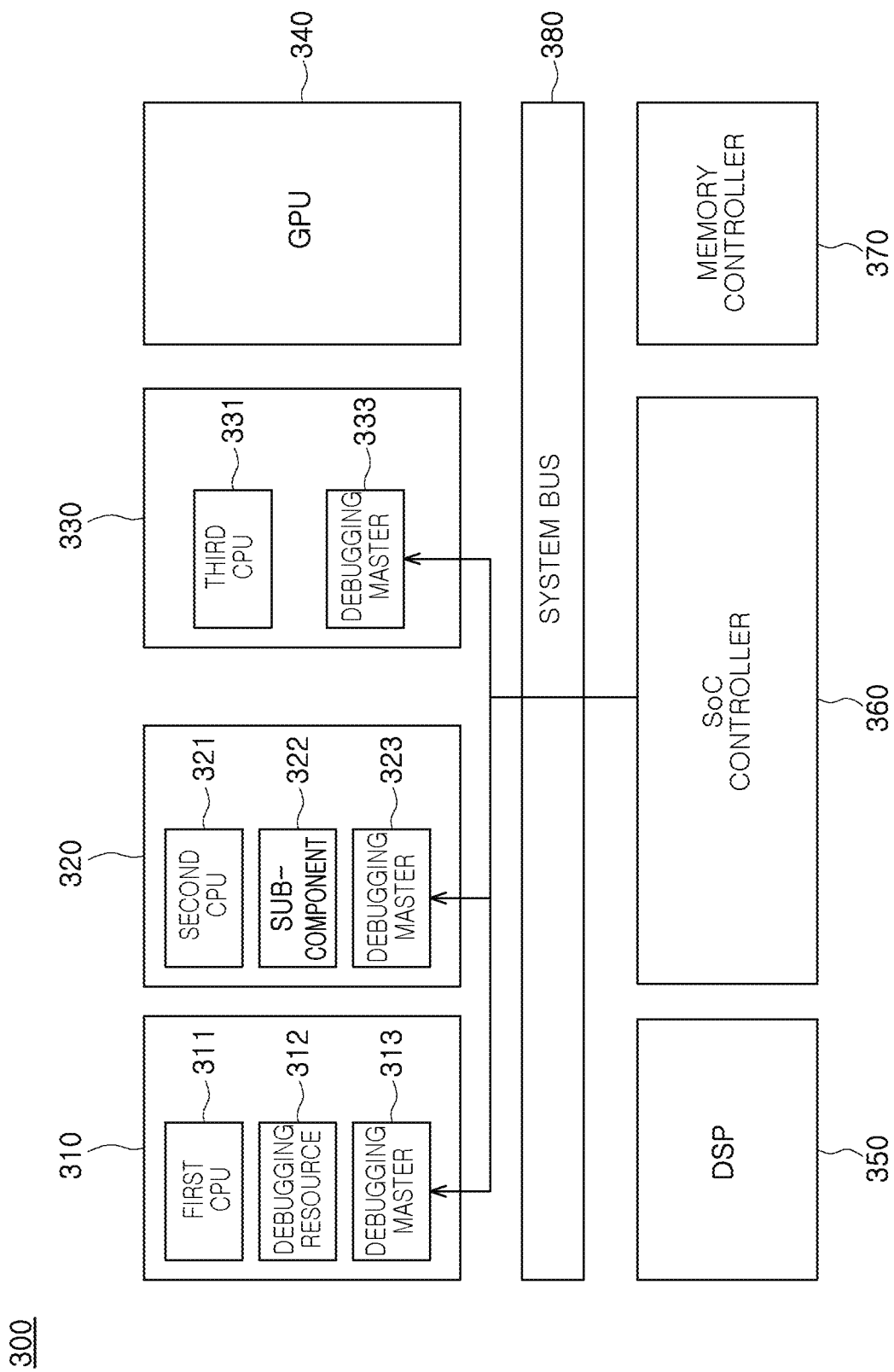
FIGS. 9 and 10 illustrate an operation of an SoC, according to an example embodiment.
Figure 10:
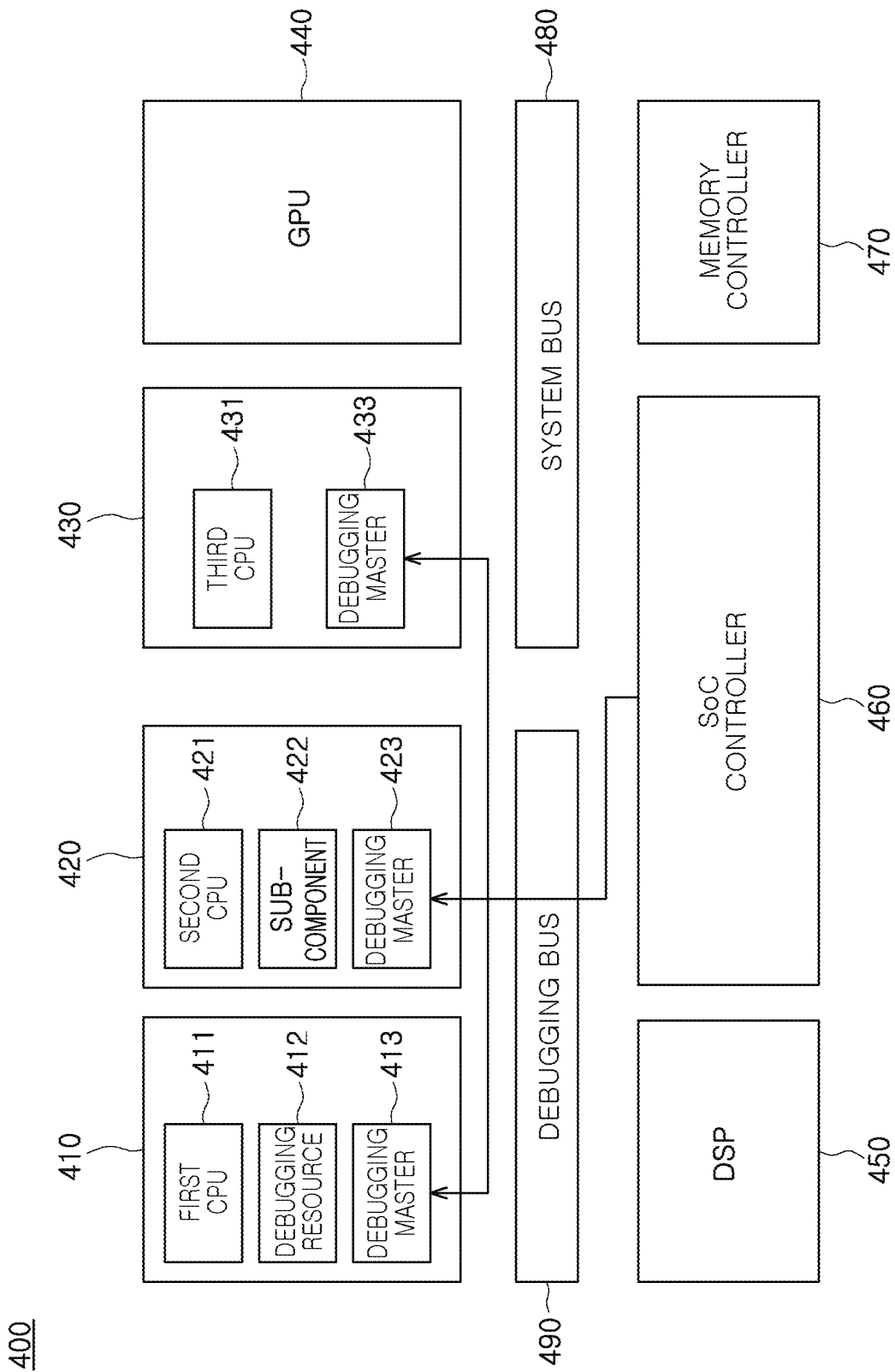

FIGS. 9 and 10 illustrate an operation of an SoC, according to an example embodiment.

First, referring to FIG. 9, in an SoC 300 according to an example embodiment illustrated in FIG. 9, a plurality of processors 310 to 330 may include debugging masters 313, 323, and 333, respectively. When the SoC 300 enters a deadlock state, an SoC controller 360 may transmit information extraction command to each of the plurality of processors 310 to 330. The information extraction command may include instructions to store and/or extract debugging information corresponding to status information when the processors 310 to 330 enter a deadlock state. The system bus 380 may not be normally operated in a deadlock state. Thus, the SoC 300 may have a debug exclusive bus which is partitioned from the system bus 380 for operation in a deadlock state.

When the debugging master 313 of the first processor 310 receives an information extraction command, the debugging master 313 may mark, as debugging information, status information which is stored in the debugging resource 312 periodically and/or when the first processor 310 enters a deadlock state. The debugging master 313 may store in a storage space the debugging information which has been marked and which is not reset when the SoC 300 is rebooted. The debugging master 323 of the second processor 320 may activate the subcomponent 322 in response to an information extraction command. The subcomponent 322, having been activated, may receive from the second CPU 321 and store debugging information. Alternatively, the debugging master 323 directly accesses the second CPU 321 in response to an information extraction command to force the second CPU 321 to output debugging information. When the debugging master 333 of the third processor 330 receives an information extraction command, an instruction to control the third CPU 331 to extract debugging information may be transmitted to the third CPU 331. The debugging information extracted through the operations described above may be stored in a storage space which is not reset by a rebooting of the SoC 300, and may be used for a debugging operation after the SoC 300 is rebooted.

An operation of an SoC 400 according to an example embodiment illustrated in FIG. 10 may be similar to an operation of the SoC 300 illustrated in FIG. 9. However, in an example embodiment illustrated in FIG. 10, a debugging bus 490 may be provided as a separate bus which is physically separated from the system bus 480. The debugging bus 490 may not be activated in a normal operation, and instead, may be activated only when an activation instruction is transmitted by the SoC controller 460, for example, when the SoC 400 enters a deadlock state. When the SoC 400 enters a deadlock state, the SoC controller 460 may transmit an information extraction command to the debugging masters 413, 423, and 433, included in the plurality of processors 410 to 430, respectively, through the debugging bus 490. The debugging masters 413, 423, and 433 may obtain debugging information from each of the first to third CPUs 311, 321, and 331, by using an instruction included in the information extraction command.

FIGS. 11 to 14 are flow diagrams provided to describe an operation of an SoC, according to an example embodiment.

Figure 11:
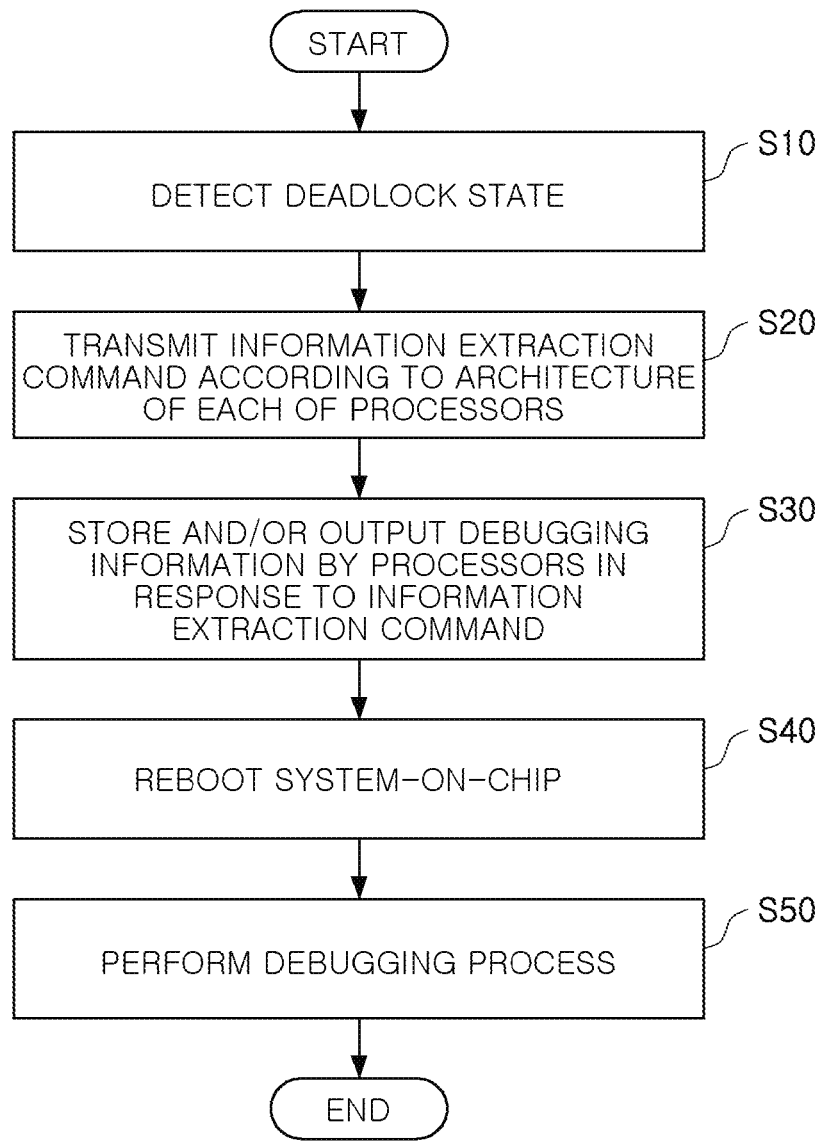
FIGS. 11 to 14 are flow diagrams provided to describe an operation of an SoC, according to an example embodiment.

First, referring to FIG. 11, an operation of an SoC, according to an example embodiment may begin by detecting a deadlock state (S10). The deadlock state may be detected by an SoC controller included in an SoC. For example, a plurality of components, included in the SoC, may include respective counter circuits therein, and each of the counter circuits may transmit a signal to the SoC controller by predetermined periods. When the SoC controller does not receive a signal from each of the counter circuits even though the period has elapsed, it may be determined that a deadlock state occurs. Moreover, when each of the components included in the SoC detects a malfunction to generate an interrupt, it may be recognized that a deadlock state occurs.

When the deadlock state is detected, the SoC controller may transmit a command appropriate to the architecture of each of the plurality of processors (S20). The command may be an information extraction command including instructions to extract debugging information indicating a status of each of the plurality of processors when the SoC enters a deadlock state. The information extraction command may be transmitted to processors through the SoC controller and a debugging master, and an information extraction command may also be transmitted to the other components of the SoC.

The processors receiving the information extraction command may store and/or output debugging information in response thereto (S30). As described previously, a method in which each of the processors stores and/or outputs debugging information may be determined according to the architecture of each of the processors. For example, in the case of a processor including a subcomponent, the subcomponent may be activated in response to an information extraction command. The subcomponent, having been activated, may extract debugging information from a CPU included in the processor and may store the debugging information in a predetermined storage space. In the case of a processor not including a subcomponent, an instruction included in an information extraction command is executed by a CPU in the processor, and debugging information may be stored in a storage space by the CPU. The storage space may be an area which is not reset even when the SoC is rebooted.

When the debugging information is stored in the area described above, the SoC may be rebooted (S40). However, according to example embodiments, only some components, entering a deadlock state, may be rebooted. When an SoC includes a plurality of processors and the plurality of processors are grouped and managed, a rebooting may be executed on a group basis.

When the rebooting is completed, an SoC may provide the debugging information, stored in S30, to a developer or a user, and the developer or the user may use the debugging information to perform a debugging operation (S50). Thus, an instruction causing a deadlock state of an SoC may be quickly identified, and thus, the debugging efficiency of a developer or a user may be improved.

Figure 12:
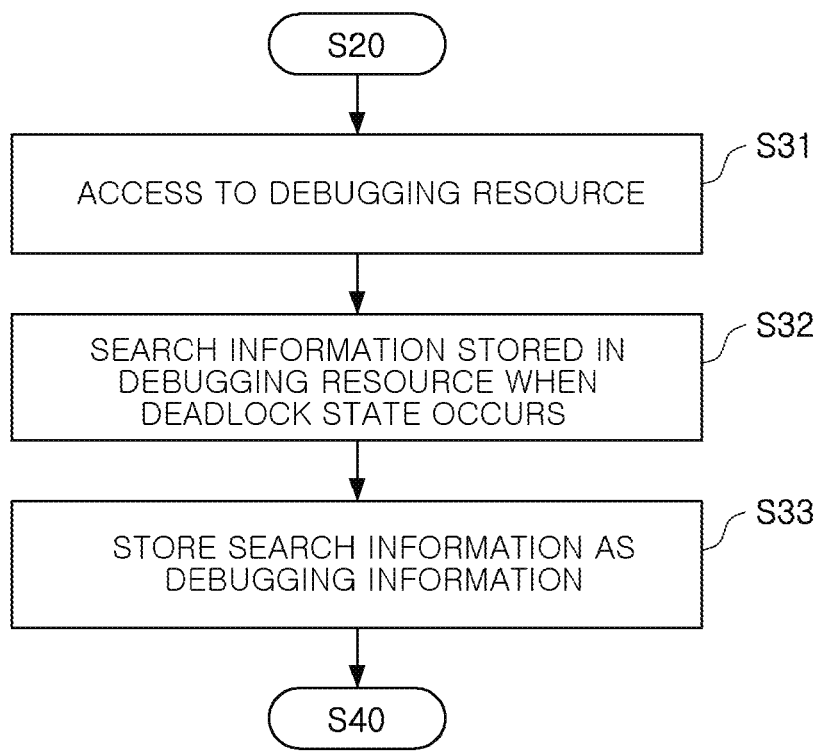

FIG. 12 is a flow diagram to further describe an example embodiment in which S30 of FIG. 11 is executed in a processor having a first architecture. The processor, receiving an information extraction command, may access to a debugging resource (S31). The debugging resource may be a space in which status information is recorded by predetermined periods or when a deadlock state occurs at a CPU, a core, or the like included in the processor. When the information extraction command is received, the processor may retrieve the status information which is stored in the debugging resource when a deadlock state occurs (S32). For example, the status information at a time point near a time point at which a deadlock state occurs may be retrieved in S32.

The processor may store the status information, having been retrieved, as debugging information (S33). As described previously, the debugging information may be recorded in a storage space which is not reset even when the SoC is rebooted.

Figure 13:
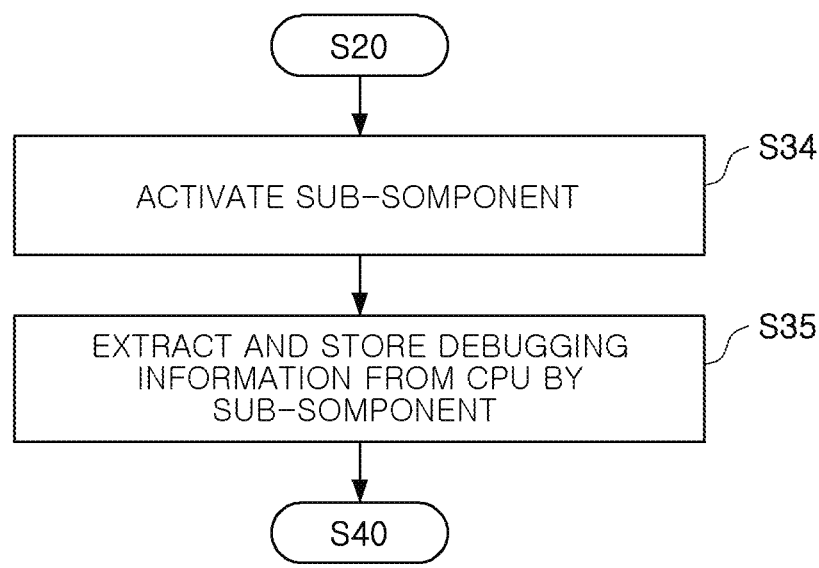

FIG. 13 is a flow diagram to further describe an example embodiment in which S30 of FIG. 11 is executed in a processor having a second architecture. The second architecture may be different from the first architecture described with reference to FIG. 12.

In an example embodiment illustrated in FIG. 13, a subcomponent included in a processor may be activated by an information extraction command (S34). The subcomponent, activated in S34 may be a logic accessing to a CPU (CPU) or a core in a processor which has entered a deadlock state to extract specific information. In other words, the activated subcomponent may extract from the CPU (CPU) and store debugging information (S35). The debugging information may be recorded in a storage space which is not reset when the SoC is rebooted.

Figure 14:
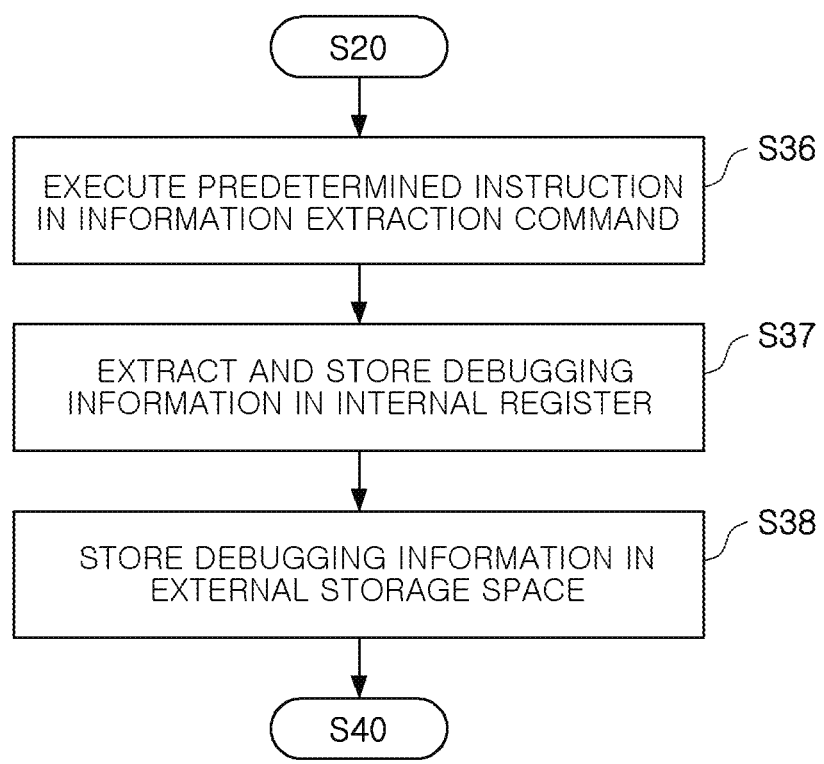

FIG. 14 is a flow diagram to further describe an example embodiment in which S30 of FIG. 11 is executed in a processor having a third architecture. The third architecture may be different from the first architecture and the second architecture, described with reference to FIGS. 11 and 12.

In an example embodiment illustrated in FIG. 14, a predetermined instruction included in the information extraction command may be executed (S36). For example, the instruction may be executed from the information extraction command by a debugging master or a processor. When the instruction is executed, the debugging information is extracted from a CPU or a core of the processor to be stored in an internal register of the processor (S37). Simultaneously, the debugging information may be recorded in a storage space outside the processor (S38). As described with reference to FIGS. 12 and 13, the debugging information may be recorded in a storage space which is not reset by a rebooting of the SoC.

The example embodiments, described with reference to FIGS. 1 to 14, may be applied to a case in which a developer or a user needs debugging information for the purpose of development and/or maintenance, in addition to a case in which an SoC enters a deadlock state. In other words, even when the SoC does not enter a deadlock state, a developer or a user who needs debugging information controls an SoC controller to output an information extraction command. In this case, components including a plurality of processors receive an information extraction command, thereby storing debugging information. The developer or the user uses the debugging information, which is stored, so that debugging may be performed regardless of the entry of a deadlock state.

Figure 15:
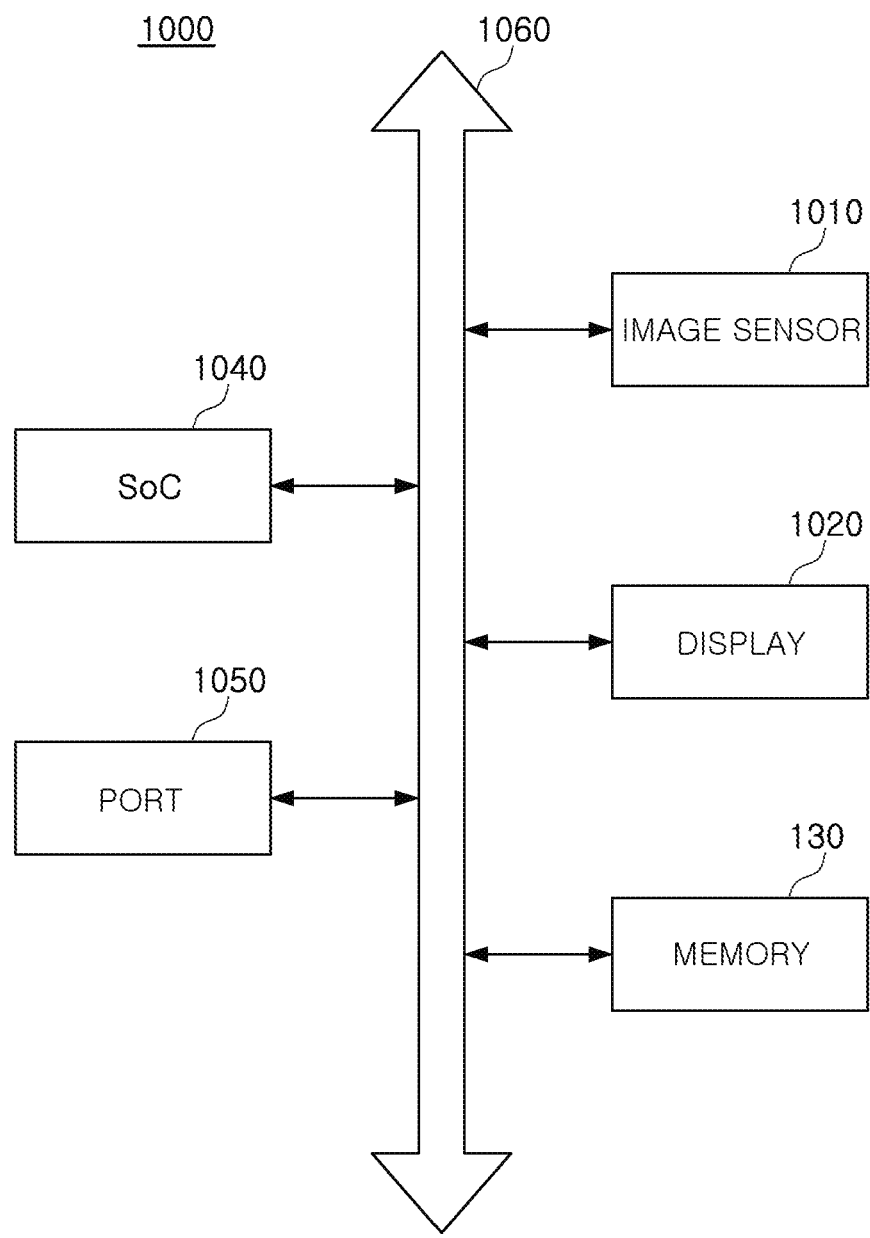
FIG. 15 is a block diagram illustrating an electronic device including an SoC, according to an example embodiment.

FIG. 15 is a block diagram illustrating an electronic device including an SoC, according to an example embodiment.

A computer device 1000 according to an example embodiment illustrated in FIG. 15 may include an image sensor 1010, a display 1020, a memory 1030, an SoC 1040, a port 1050, and the like. The computer device 1000 may further include a wired/wireless communications device, a power supply, and the like. Among components illustrated in FIG. 15, the port 1050 may be provided for the computer device 1000 to communicate with a video card, a sound card, a memory card, a universal serial bus (USB) device, and the like. The computer device 1000 may be a smartphone, a tablet PC, a smart wearable device, and the like, as well as a desktop computer and a laptop computer according to the related art.

The SoC 1040 may perform a certain operation, an instruction, a task, and the like. The SoC 1040 may communicate with other devices connected to the port 1050, in addition to the image sensor 1010, the display 1020, and the memory device 1030, through the bus 1060. The SoC 1040 may include a plurality of processors designed according to different architectures, and may obtain debugging information according to various example embodiments described with reference to FIGS. 1 to 14 when entering a deadlock state.

The memory 1030 may be a storage medium storing data necessary for an operation of the computer device 1000, or multimedia data. The memory 1030 may include a volatile memory such as a random access memory (RAM) or a non-volatile memory such as a flash memory. In addition, the memory 1030 may include at least one of a solid state drive (SSD), a hard disk drive (HDD), and an optical disk drive (ODD), as a storage device. The I/O device 1020 may include input devices such as a keyboard, a mouse, and a touch screen and output devices such as a display and an audio output unit provided to a user.

The image sensor 1010 may be mounted on a package substrate to be connected to the processor 1040 by the bus 1060 or other communications unit. The image sensor 1010 may be applied to the computer device 1000 in the form according to various example embodiments described with reference to FIGS. 1 to 14.

Figure 16:
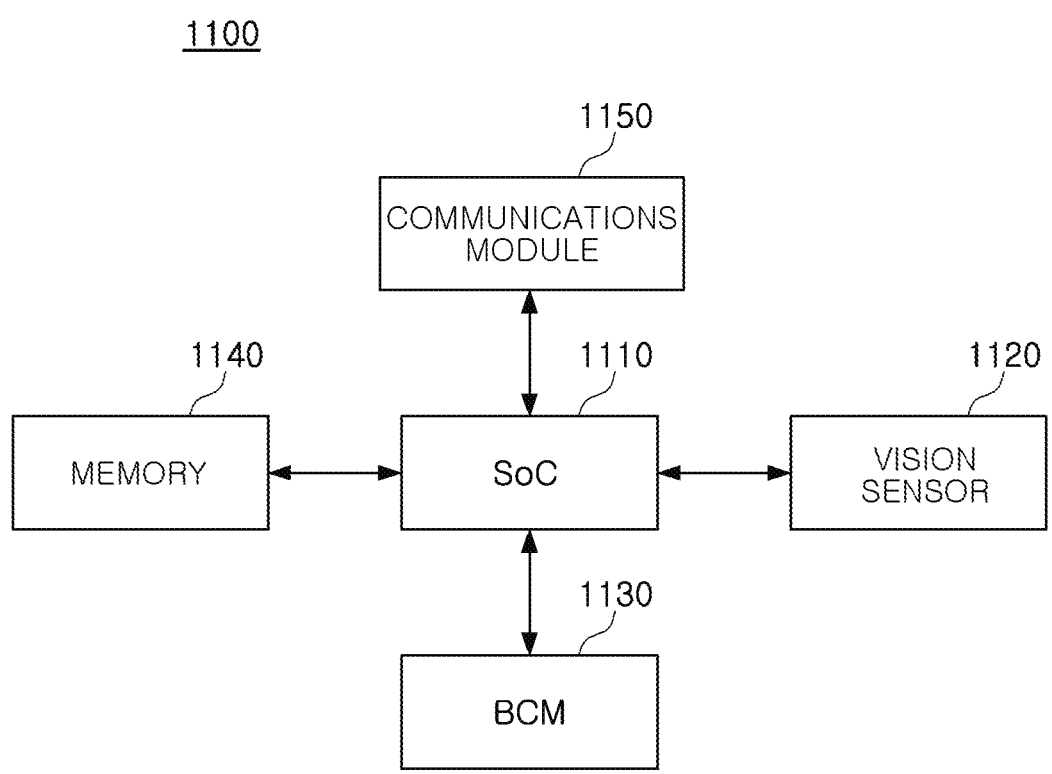
FIG. 16 is a block diagram illustrating an autonomous vehicle including an SoC, according to an example embodiment.

FIG. 16 is a block diagram illustrating an autonomous vehicle including an SoC, according to an example embodiment.

Referring to FIG. 16, an autonomous vehicle 1100 may include an SoC 1110, a vision sensor 1120, a body control module 1130, an memory 1140, a communications module 1150, and the like. The SoC 1110 may include a plurality of processors designed according to different architectures, and may obtain debugging information according to various example embodiments described with reference to FIGS. 1 to 14 when entering a deadlock state.

The SoC 1110 may control the vision sensor 1120, the body control module 1130, the memory 1140, and the communications module 1150, thereby providing an autonomous driving function of the autonomous vehicle 1100. For example, the SoC 1110 may determine a driving environment using visual information around a vehicle, collected by the vision sensor 1120, traffic information received through the communications module 1150, and the like, and may control the body control module 1130 together with a driving system of a vehicle based on the driving environment.

As set forth above, according to example embodiments of the present inventive concept, when an SoC with a plurality of processors designed according to various architectures and mounted therein enters a deadlock state, before an SoC is rebooted, at least a portion of processors may be controlled to store and/or output debugging information based on the architecture of each of the processors. Thus, debugging is performed using the debugging information of processors causing a deadlock state in the SoC, so that a cause of the deadlock state may be accurately identified, and the efficiency of debugging may be also improved.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements, modules or units (collectively "components" in this paragraph) represented by a block in the drawings, such as the debugging resource 112, the subcomponent 122, the debugging master 162, and the SoC controller 161 in FIG. 4, may be embodied as various numbers of hardware, software and/or firmware structures that execute respective functions described above, according to an example embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors.

An embodiment provided in the above descriptions is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

While example embodiments have been shown and described above, it will be apparent to those skilled in the art that modifications and variations could be made without departing from the scope of the inventive concept, as defined by the appended claims.

What is claimed is:

1. A system-on-chip (SoC), comprising:
a plurality of processors configured to store respective debugging information in response to respective information extraction commands received in a deadlock state, the plurality of processors having different architectures;
a system bus connected to the plurality of processors; and
an SoC manager configured to generate the respective information extraction commands differently according to an architecture of each of the plurality of processors in response to detecting occurrence of the deadlock state, and transmit the respective information extraction commands to the plurality of processors through a bus separated from the system bus,
wherein the SoC manager is further configured to reset the plurality of processors and the system bus after the plurality of processors store the respective debugging information in response to the respective information extraction commands.

2. The SoC of claim 1, wherein the bus is a debugging bus physically separated from the system bus, or logically separated from the system bus by partitioning the system bus,
wherein the SoC manager transmits the respective information extraction commands to the plurality of processors through the debugging bus in response to detecting the deadlock state.

3. The SoC of claim 1, wherein the respective debugging information comprises a bit value of a status register included in at least one of the plurality of processors.

4. The SoC of claim 1, wherein the SoC manager comprises:
an SoC controller configured to detect the deadlock state; and
a debugging master configured to transmit the respective information extraction commands to the plurality of processors.

5. The SoC of claim 4, wherein at least one of the plurality of processors comprises:
a central processing unit (CPU) configured to perform an arithmetic operation; and
a debugging resource configured to store status information generated by predetermined periods by the CPU, and output at least a portion of the status information as corresponding debugging information in response to a corresponding information extraction command.

6. The SoC of claim 5, wherein the corresponding debugging information output by the debugging resource is stored in a storage space which is not reset by a rebooting of the plurality of processors and the system bus.

7. The SoC of claim 4, wherein at least one of the plurality of processors comprises:
a central processing unit (CPU) configured to perform an arithmetic operation; and
a subcomponent configured to extract from the CPU and store corresponding debugging information in response to a corresponding information extraction command.

8. The SoC of claim 4, wherein at least one of the plurality of processors comprises a central processing unit (CPU) configured to execute a predetermined instruction included in a corresponding information extraction command to extract corresponding debugging information, and store the corresponding debugging information in a storage area which is not reset by a rebooting of the plurality of processors and the system bus.

9. The SoC of claim 1, wherein each of the plurality of processors comprises a debugging master configured to store corresponding debugging information in response to a corresponding information extraction command.

10. The SoC of claim 9, wherein at least one of the plurality of processors comprises:
   a central processing unit (CPU) configured to perform an arithmetic operation; and
   a debugging resource configured to store status information generated by predetermined periods by the CPU, and
   wherein the debugging master marks at least a portion of the status information as the corresponding debugging information in response to the corresponding information extraction command.

11. The SoC of claim 9, wherein at least one of the plurality of processors comprises:
   a central processing unit (CPU) configured to perform an arithmetic operation; and
   a subcomponent configured to extract from the CPU and store the corresponding debugging information.

12. The SoC of claim 11, wherein the debugging master is configured to activate the subcomponent in response to the corresponding information extraction command.

13. The SoC of claim 11, wherein the debugging master is configured to control the subcomponent to extract the corresponding debugging information from the CPU, in response to the corresponding information extraction command.

14. The SoC of claim 9, wherein the debugging master is configured to store the corresponding debugging information in a storage space, which is not reset by a rebooting of the plurality of processors and the system bus, in response to the corresponding information extraction command.

15. A system-on-chip (SoC), comprising:
   a plurality of processors each of which comprises a first interface, a second interface, and a central processing unit (CPU);
   a system bus connected to the first interface;
   at least one debugging master connected to the second interface; and
   an SoC controller connected to the plurality of processors through the system bus, and configured to detect a deadlock state in the plurality of processors,
   wherein the debugging master is configured to transmit respective information extraction commands, generated based on an architecture of each of the plurality of processors, to the plurality of processors, in response to an instruction of the SoC controller when the deadlock state occurs, and
   wherein the plurality of processors are configured to generate respective status information as respective debugging information in response to the respective information extraction commands.

16. The SoC of claim 15, wherein each of the plurality of processors comprises a debugging master of the at least one debugging master.

17. The SoC of claim 16, wherein the debugging master is connected to the second interface through the system bus.

18. The SoC of claim 15, wherein the respective status information comprises status information about at least one of the plurality of processors immediately before and after the deadlock state occurs.

19. A system-on-chip (SoC), comprising:
   a first processor designed according to a first architecture;
   a second processor designed according to a second architecture, different from the first architecture;
   an SoC controller configured to detect a deadlock state in at least one of the first processor and the second processor; and
   a debugging master connected to a slave interface of each of the first processor and the second processor, and configured to obtain respective debugging information about the first processor and the second processor by transmitting respective information extraction commands to the first processor and the second processor through the slave interface before the first processor and the second processor are reset when the deadlock state occurs,
   wherein the first processor and the second processor are configured to store the respective debugging information using different methods in response to the information extraction command.

* * * * *